(12) United States Patent
Chander et al.

(10) Patent No.: US 9,812,191 B1
(45) Date of Patent: Nov. 7, 2017

(54) MEMORY CIRCUIT WITH NEGATIVE VOLTAGE ASSIST

(71) Applicant: Taiwan Semiconductor Manufacturing Co., Ltd., Hsin-Chu (TW)

(72) Inventors: Avinash Chander, Jhubei (TW); Yen-Huei Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/279,944

(22) Filed: Sep. 29, 2016

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
None
See application file for complete search history.

(56) References Cited

U.S. PATENT DOCUMENTS

| | | | |
|---|---|---|---|
| 5,539,353 A * | 7/1996 | Kajimoto | G05F 1/577 327/323 |
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |
| 2014/0153345 A1 | 6/2014 | Kim et al. | |
| 2014/0233330 A1 | 8/2014 | Ko et al. | |
| 2015/0348598 A1 | 12/2015 | Wang et al. | |
| 2015/0371702 A1 | 12/2015 | Wu et al. | |
| 2015/0380077 A1 | 12/2015 | Wu et al. | |
| 2015/0380078 A1 | 12/2015 | Liaw | |

* cited by examiner

*Primary Examiner* — James G Norman
(74) *Attorney, Agent, or Firm* — Duane Morris LLP

(57) ABSTRACT

A memory device includes: a memory array comprising a first plurality of bit cells arranged along a first column; and a negative bit line (NBL) circuit, coupled to the memory array. The NBL circuit includes: a first pair of conducting gates that are coupled to the first plurality of bit cells through a bit line (BL) and a bit bar line (BBL) of the first column, respectively; and a pair of trigger circuits, coupled to the first pair of conducting gates, respectively, and configured to monitor voltage levels present on the BL and BBL of the first column through the respective first pair of conducting gates, and based on the monitored voltage levels, to assert an NBL enable signal so as to cause a negative voltage to be applied on either the BL or the BBL of the first column.

20 Claims, 8 Drawing Sheets

_US 9,812,191 B1_

MEMORY CIRCUIT WITH NEGATIVE VOLTAGE ASSIST

BACKGROUND

A static random access memory (SRAM) is commonly used in integrated circuits. SRAM cells have the advantageous feature of holding data without a need for refreshing. SRAM cells may include different numbers of transistors and are often accordingly referred to by the number of transistors, for example, six-transistor (6-T) SRAM, eight-transistor (8-T) SRAM, and the like. The transistors typically form a data latch for storing a bit. Additional transistors may be added to control the access to the transistors. SRAM cells are typically arranged as an array having rows and columns. Typically, each row of SRAM cells is connected to a word line, which determines whether the row of SRAM cells is selected or not. Each column of SRAM cells is connected to a bit line (or a pair of bit lines), which is used for storing a bit into, or reading a bit from, the SRAM cell.

With the increasing down-scaling of integrated circuits, the power supply voltages of the integrated circuits are reduced, along with the power supply voltages of memory circuits. Accordingly, read and write margins of the SRAM cells, which are used to indicate how reliably the bits of the SRAM cells can be read from and written into, are reduced. Due to the existence of static noise, the reduced read and write margins may cause errors in the respective read and write operations.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

As mentioned above, with the increasing down-scaling of integrated circuits, the power supply voltages of the integrated circuits are reduced, along with the power supply voltages of memory devices. Various approaches have been explored to lower $VCC_{min}$, which is the minimum power supply voltage VCC required for reliable read and write operations, and to suit the ever-decreasing power supply voltages. For example, write assist circuits are used in a memory device to improve cell write-ability at low power supply voltages, particularly when the word line voltage is suppressed. One of the write assist circuits typically applies a negative voltage on the bit line that is used to write a logical 0. However, to assure that a negative voltage is efficiently applied on the bit line at a suitable timing (i.e., without an undesirable delay), one or more additional circuits (e.g., a boost voltage converter) may be needed, which may disadvantageously incur a variety of issues, for example, real estate issues, power consumption issues, etc. Thus, existing memory devices using the negative voltage bit line technique described above have not been entirely satisfactory.

The present disclosure provides various embodiments of a memory device that includes a negative bit line (NBL) circuit configured to monitor a voltage level on at least one bit line of the memory device, and enable a negative voltage to be applied on the at least one bit line only when the NBL circuit assures that the voltage level on the bit line decreases to 0 V, or substantially close to 0 V. Moreover, the disclosed NBL circuit may be integrated either into an input/out (I/O) circuit of the memory device to provide a local negative voltage to one or more bit lines of a local memory array of the memory device, which will be described below in further detail with respect to FIGS. 2, 3, 4, and 5, or a control logic circuit of the memory device to globally provide a negative bit line enable (control) signal to, at least part of, the I/O circuits of the memory device, which will be described below in further detail with respect to FIGS. 6A and 6B. As such, the disclosed NBL circuit of the memory device may effectively provide a negative voltage to a bit line of the memory device at an suitable timing when the bit line is used to perform a write operation, which in turn resolves the above-identified issues present among existing memory devices.

Figure 1:
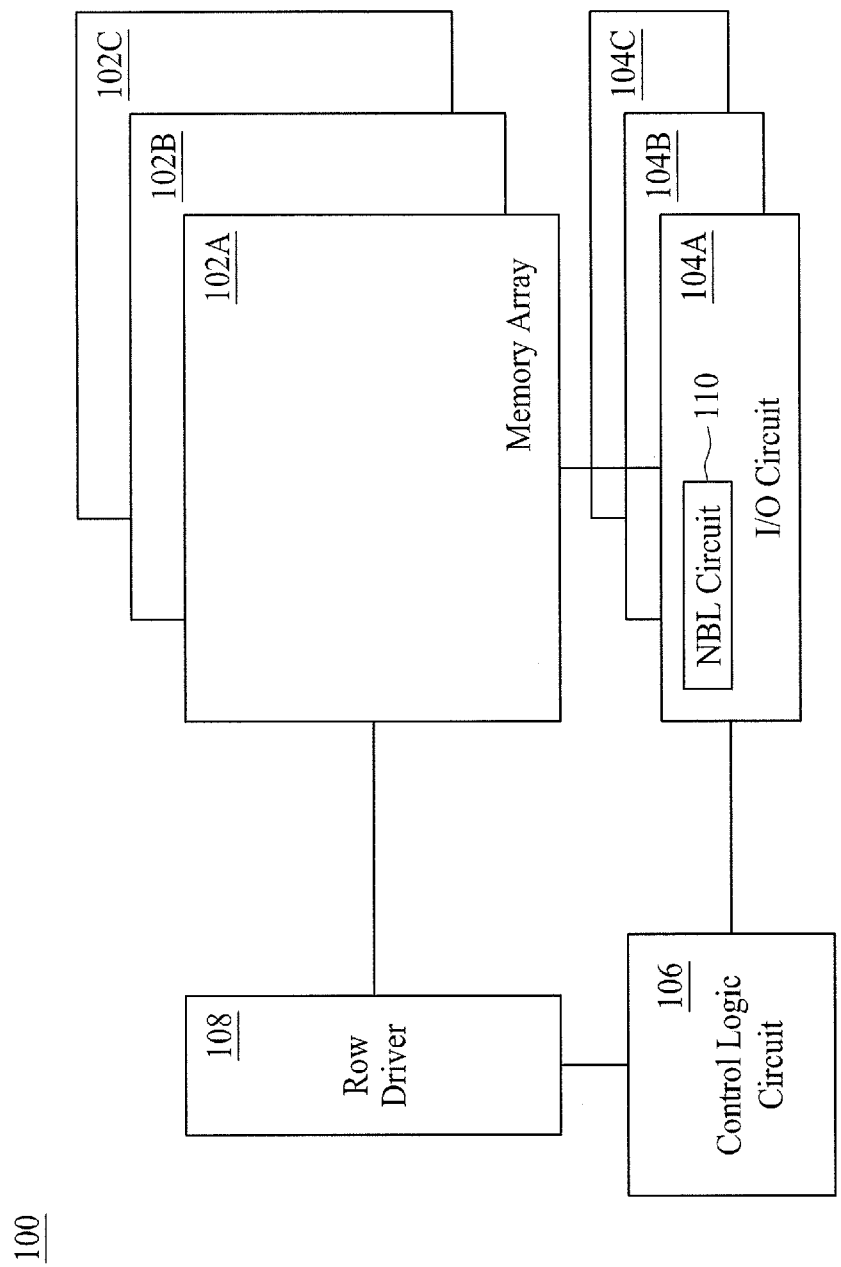
FIG. 1 illustrates an exemplary block diagram of a memory device that includes an input/output (I/O) circuit including a negative bit line (NBL) circuit, in accordance with some embodiments.

FIG. 1 illustrates an exemplary block diagram of a memory device 100 that includes a negative bit line (NBL) circuit, in accordance with various embodiments. As shown, the memory device 100 includes one or more memory arrays (102A, 102B, 102C), one or more input/output (I/O) circuits (104A, 104B, 104C) each coupled to a respective memory array, a control logic circuit 106 coupled to the one or more I/O circuits (104A, 104B, 104C), and a row driver 108 coupled to the control logic circuit 106 and the one or more memory arrays (102A, 102B, 102C). For clarity, only three memory arrays are shown. However, any desired number of memory arrays may be included in the memory device 100 in accordance with various embodiments while remaining within the scope of the present disclosure.

As described above, in some embodiments, each memory array may be coupled with a respective I/O circuit. For example, the memory array 102A is coupled with the I/O circuit 104A; the memory array 102B is coupled with the I/O circuit 104B; and the memory array 102C is coupled with the I/O circuit 104C. In the illustrated embodiment of FIG. 1, the I/O circuit 104A includes a negative bit line (NBL) circuit 110. In accordance with various embodiments, each I/O circuit may include a respective NBL circuit that is substantially similar to the NBL circuit 110. In some embodiments, the NBL circuit included in each I/O circuit may be configured to locally provide a negative bit line voltage to its respective memory array. Thus, for clarity, the following discussion will be directed to the NBL circuit 110 of the I/O circuit 104A only. In some alternative or additional embodiments, the control logic circuit 106 may include an NBL circuit that is substantially similar to the NBL circuit 110. Such an NBL circuit included in the control logic circuit 106 may be configured to globally provide a negative bit line control signal to the I/O circuits (e.g., 104A, 104B, 104C, etc.) so as to allow each of the I/O circuits to provide a negative bit line voltage to a respective memory array, which will be described in further detail below with respect to FIGS. 6A and 6B.

In some embodiments, each of the memory arrays (102A, 102B, 102C, etc.) of the memory device 100 includes a plurality of bit cells that are arranged in a column-row configuration. Each bit cell is configured to store/present a data bit (either a logical 1 or a logical 0). The I/O circuit, corresponding to each memory array, is configured to access the bit cells (e.g., read a data bit from the bit cell, write a data bit to the bit cell) of the corresponding memory array. For example, the I/O circuit 104A is configured to write a data bit to a bit cell of the memory array 102A. Further, the NBL circuit 110 of the I/O circuit 104A is configured to determine when to provide a negative voltage to a bit line of the memory array 102A while writing a data bit to a bit cell (coupled to the bit line). The memory array 102A and the I/O circuit 104A (and the NBL circuit 110) will be described in further detail below with respect to FIG. 2.

In some embodiments, the control logic circuit 106 is configured to provide one or more control signals to control the NBL circuit 110, which will be described below. As described above, in some embodiments, the control logic circuit 106 may include a global NBL circuit. In such embodiments, the control logic circuit 106 may be further configured to control the global NBL circuit to determine when to provide a negative bit line control signal to one or more of the coupled I/O circuits, which will be described below with respect to FIGS. 6A and 6B. The row driver 108 is configured to select/assert a word line of each of the memory arrays (102A, 102B, 102C, etc.) in response to a WL assertion signal so as to allow a write operation to be performed on one or more bit cells along the asserted word line, which will be described below with respect to FIG. 3.

Figure 2:
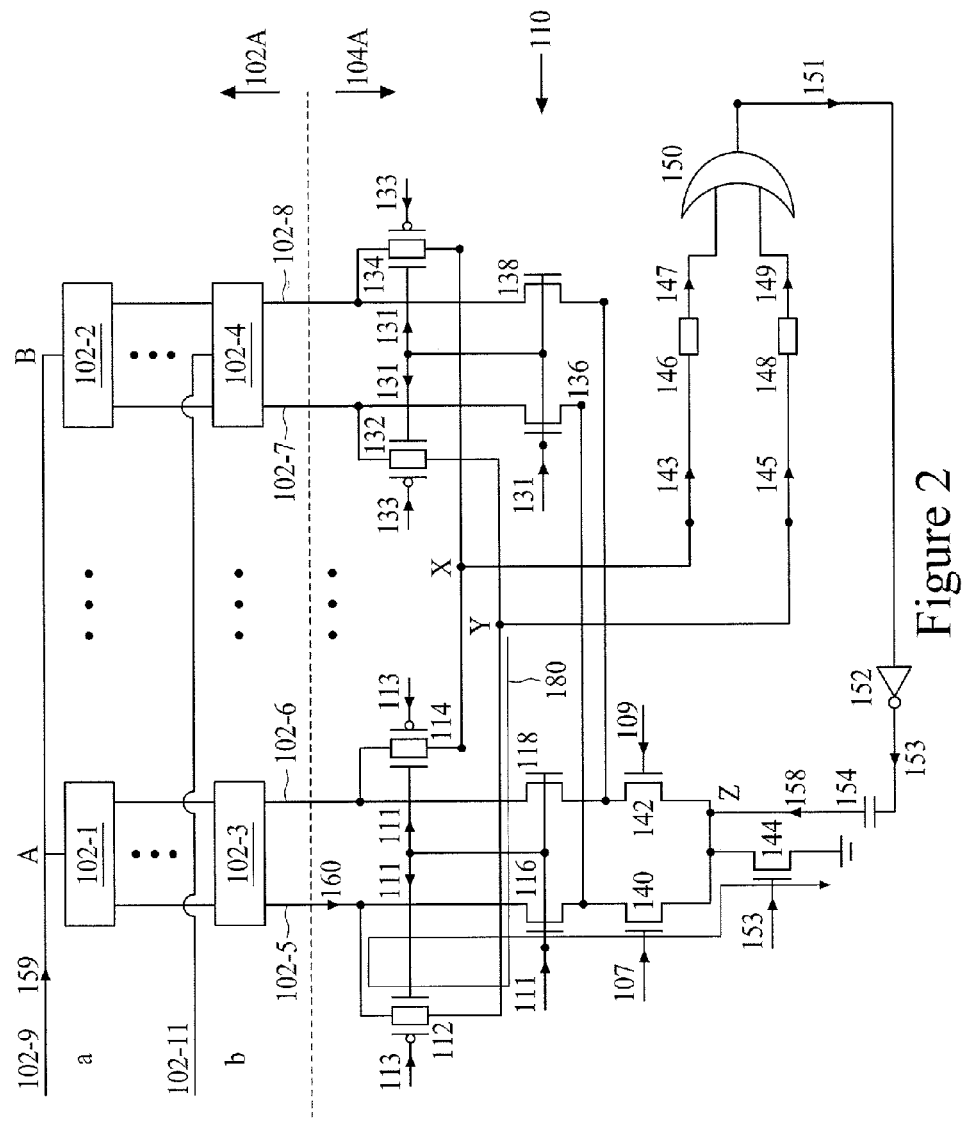
FIG. 2 illustrates an exemplary circuit diagram of the NBL circuit of FIG. 1, in accordance with some embodiments.

FIG. 2 illustrates an exemplary circuit diagram of the memory array 102A and coupled I/O circuit 104A of the memory device 100, in accordance with various embodiments. As shown, the memory array 102A includes bit cells 102-1, 102-2, 102-3, 102-4, etc. Although the illustrated embodiment of the memory array 102A in FIG. 2 only shows four bit cells, any desired number of bit cells may be included in the memory array 102A while remaining within the scope of the present disclosure.

As described above, the bit cells of the memory array 102A is arranged in a column-row configuration. As illustrated, the bit cells 102-1 and up to 102-2 are arranged in a first row (row "a") wherein the bit cells 102-1 and 102-2 are arranged in different and separate columns (columns "A" and "B"), respectively. Similarly, the bit cells 102-3 and up to 102-4 are arranged in a second row (row "b") wherein the bit cells 102-3 and 102-4 are arranged in different and separate columns (A and B), respectively. Moreover, in some embodiments, each column includes a bit line (BL) and a bit bar line (BBL) that are coupled to the bit cells arranged along that column, respectively, and each of the bit cells along that column is coupled to a respective word line (WL) that belongs to a respective row. For example, column A includes BL 102-5 and BBL 102-6 that are coupled to the bit cells 102-1 and 102-3, respectively, and the bit cells 102-1 and 102-3 are coupled to WL 102-9 (of row a) and WL 102-11 (of row b), respectively, and column B includes BL 102-7 and BBL 102-8 that are coupled to the bit cells 102-2 and 102-4, respectively, and the bit cells 102-2 and 102-4 are coupled to WL 102-9 (of row a) and WL 102-11 (of row b), respectively. It is understood that the number of pairs of BL's and BBL's corresponds to the number of columns of the memory array 102A and the number of WL's corresponds to the number of rows of the memory array 102A. For example, two columns and two rows are shown in the illustrated embodiment of FIG. 2, and accordingly, two pairs of BL's and BBL's (the pair of 102-5 and 102-6, and the pair of 102-7 and 102-8) and two WL's (102-9 and 102-11) are shown. In some embodiments, any desired number of columns may be arranged between the columns A and B, and similarly any desired number of rows may be arranged between the rows a and b, while remaining within the scope of the present disclosure.

The I/O circuit 104A shown in FIG. 2 includes the NBL circuit 110 shown in FIG. 1, as described in further detail below. The NBL circuit 110 is coupled to the bit cells (102-1, 102-2, 102-3, 102-4, etc.) through the respective BL and BBL (102-5, 102-6, 102-7, 102-8, etc.). As shown in FIG. 2, in some embodiments, the NBL circuit 110 includes plural transmission (TX) gates 112, 114, 132, and 134, transistors 116, 118, 131, 138, 140, 142, and 144, trigger circuits 146 and 148, an OR gate 150, an inverter 152, and a boosting capacitor 154.

In some embodiments, the transistors 116, 118, 131, 138, 140, 142, and 144 each includes an NMOS transistor. Although the illustrated embodiments of FIG. 2 shows that 116, 118, 131, 138, 140, 142, and 144 are NMOS transistors, any of a variety of transistors or devices that are suitable for use in a memory device may be implemented as at least one of 116, 118, 131, 138, 140, 142, and 144 such as, for example, a bipolar junction transistor (BJT), a high-electron mobility transistor (HEMT), etc.

Each TX gate is coupled between either a BL or a BBL (of a column) and a trigger circuit. For example, as shown, the TX gate 112 is coupled between the BL 102-5 of column A and the trigger circuit 148; the TX gate 114 is coupled between the BBL 102-6 of column A and the trigger circuit 146; the TX gate 132 is coupled between the BL 102-7 of column B and the trigger circuit 148; the TX gate 134 is coupled between the BBL 102-8 of column B and the trigger circuit 146. In other words, each column may include a pair of TX gates coupled to that column's BL and BBL, respectively. For example, column A is coupled with the pair of TX gates 112 and 114; column B is coupled with the pair of TX gates 132 and 134. Thus, it is understood that when more columns are disposed between the columns A and B, more pairs of TX gates will be correspondingly disposed between the pairs of TX gates (112 and 114) and (132 and 134). In some embodiments, each pair of TX gates is concurrently controlled by a column selection (CS) signal (and a complementary column selection (CCS) signal). For example, the TX gates 112 and 114 may become "conducting" by asserting the CS signal 111 to be a logical 1 (and accordingly asserting the CCS signal 113 to be a logical 0), which will be discussed in further detail below with respect to FIG. 3.

In accordance with some embodiments of the present disclosure, a TX gate is configured to selectively conduct or block a signal from an input of the TX gate to an output of the TX gate, in response to a first control signal (and a second control signal that is complementary to the first control signal). More specifically, when the control signal is at a first logical state (either a logical 1 or a logical 0), the TX gate is configured to conduct the signal received at its input, through itself, and provide an output signal at its output. Similarly, when the control signal is at a second logical state (either a logical 0 or a logical 1, complementary to the first logical state), the TX gate is configured to block the signal from the input to the output. Generally, when a TX gate is conducting, the TX gate serves as a resistor. In the illustrated embodiment of FIG. 2, the TX gate 112 conducts when the CS signal 111 is at a logical 1 (and the CCS signal 113 is at a logical 0); the TX gate 114 conducts when the CS signal 111 is at a logical 1 (and the CCS signal 113 is at a logical 0); the TX gate 132 conducts when the CS signal 131 is at a logical 1 (and the CCS signal 133 is at a logical 0); and the TX gate 134 conducts when the CS signal 131 is at a logical 1 (and the CCS signal 133 is at a logical 0). The operations of the TX gates (e.g., 112, 114, 132, 134, etc.) will be described in further detail below with respect to FIG. 3.

Referring still to FIG. 2, each column (and corresponding pair of BL and BBL) is coupled with a pair of column selection transistors, wherein such a pair of column selection transistors is each gated (controlled) by the CS signal 111 (which will be discussed below). For example, column A (and BL 102-5 and BBL 102-6) is coupled with a pair of column selection transistors 116 and 118; column B (and BL 102-7 and BBL 102-8) is coupled with a pair of column selection transistors 131 and 138. Similarly, it is understood that when more columns are disposed between the columns A and B of the memory array 102A, more pairs of column selection transistors will be correspondingly disposed between the pairs of column selection transistors (116 and 118) and (136 and 138).

In some embodiments, the NBL circuit 110 includes a pair of write enable transistors 140 and 142 coupled to the BL's (102-5, 102-7, etc.) and the BBL's (102-6, 102-8, etc.), respectively, of the memory array 102A. In some embodiments, the pair of write enable transistors 140 and 142 are gated (controlled) by a complementary DATA signal 107 and a DATA signal 109, respectively, wherein the DATA and the complementary DATA signals vary in accordance with a write enable (W_E) signal, which will be described below.

In some embodiments, the trigger circuits 146 and 148 are configured to monitor voltage levels on nodes X and Y, respectively. The voltage levels on the nodes X and Y over time are referred to as monitored signals 143 and 145, respectively, hereinafter. In some embodiments, the trigger circuit 146 is configured to provide a first signal 147 in response to a change of the monitored signal 143, and similarly, the trigger circuit 148 is configured to provide a second signal 149 in response to a change of the monitored signal 145. The OR gate 150 is coupled to the trigger circuits (146 and 148) and is configured to receive the signals 147 and 149 from the trigger circuits 146 and 148, respectively, at the OR gate 150's inputs. Further, the OR gate 150 is configured to perform an OR logic function on the two signals 147 and 149, and provide a negative bit line enable (NBL_E) signal 151 to coupled inverter 152 and boost capacitor 154. In some embodiments, the NBL circuit 110 further includes a negative bit line enable transistor 144 that is gated (controlled) by a complementary NBL_E (CNBL_E) signal 153.

In some embodiments, each of the trigger circuits 146 and 148 may be implemented as a Schmitt trigger. The Schmitt trigger is configured to retain its output (e.g., signals 147 and 149) until its input (e.g., signals 143 and 145) changes sufficiently to trigger a change (of the output).

In some embodiments, the Schmitt trigger 146 is configured to track a voltage level of the monitored signal 143 at its input, and based on the voltage value of the monitored signal 143, either retain a first logical state of the first signal 147, or change the first logical state to a second logical state. In an example in which the monitored signal 143 was pre-charged to a higher voltage (e.g., Vdd), the Schmitt trigger 146 may output, and retain, the first signal 147 at a logical 0. When the monitored signal 143 drops from Vdd to a predefined threshold, e.g., 30% Vdd, or lower, the Schmitt trigger 146 may transition the first signal 147 from the logical 0 to a logical 1. Otherwise (i.e., the monitored signal 143 does not drop below 30% Vdd), the Schmitt trigger 146 may retain the first signal 147 at the logical 0. The predefined threshold, 30% Vdd, is typically referred to as a "trip point" of the Schmitt trigger 146. Similarly, when the voltage level of the monitored signal 145 drops from Vdd to a predefined threshold, e.g., 30% Vdd, or lower, the Schmitt trigger 148 may transition the second signal 149 from a logical 0 to a logical 1. Otherwise, the Schmitt trigger 148 may retain the second signal 149 at the logical 0. Again, the 30% Vdd is typically referred to as the trip point of the Schmitt trigger 148.

Referring still to FIG. 2, the inverter 152 is configured to receive the NBL_E signal 151 from the OR gate 150, and provide the CNBL_E signal 153 to the boosting capacitor 154 and the negative bit line enable transistor 144, as shown. In some embodiments, when the CNBL_E signal 153 transitions from a logical 1 to a logical 0, the negative bit line enable transistor 144 decouples node Z from ground, and the boosting capacitor 154 starts to provide a negative voltage to the node Z (and accordingly to the BL 102-5), which will be described in further detail below with respect to FIG. 3.

In general, to write a desired logical state to a bit cell of a memory array of the memory device 100 (e.g., 102A), the bit cell's coupled BL and BBL are pre-charged to a supplied voltage of the memory array (e.g., Vdd), and then a first voltage that corresponds to the desired logical state (e.g., either Vdd or ground) is applied to the bit cell through the bit cell's coupled BL, and a second voltage that corresponds to a second logical state complementary to the desired logical state is applied to the bit cell through the bit cells' coupled BBL. For example, to write a logical 0 to the bit cell 102-1, the BL 102-5 and BBL 102-6 are pre-charged to Vdd, respectively, and the bit cell 102-1 can be accessed by asserting the WL 102-9. Subsequently, the BL 102-5 is applied with a voltage that is equal to ground (i.e., 0 V), and the BBL 102-6 is applied with a voltage that is equal to Vdd. As described above, to enhance a write-ability of the bit cell 102-1, the BL 102-5 may be further pulled below 0 V (i.e., applying the BL 102-5 with a negative voltage). The disclosed NBL circuit 110 provides such a functionality (i.e., provision of a negative voltage on a BL that is used to write a logical 0) and further determines an accurate timing to apply the negative voltage to the BL. With such an accurate timing, in some embodiments, the disclosed memory device 100 does not need an additional voltage converter to assure that a negative voltage is efficiently applied to the BL and thus obviates any real estate and/or delay issues associated therewith. The operation of the NBL circuit 110 is described below in conjunction with FIG. 3.

Figure 3:
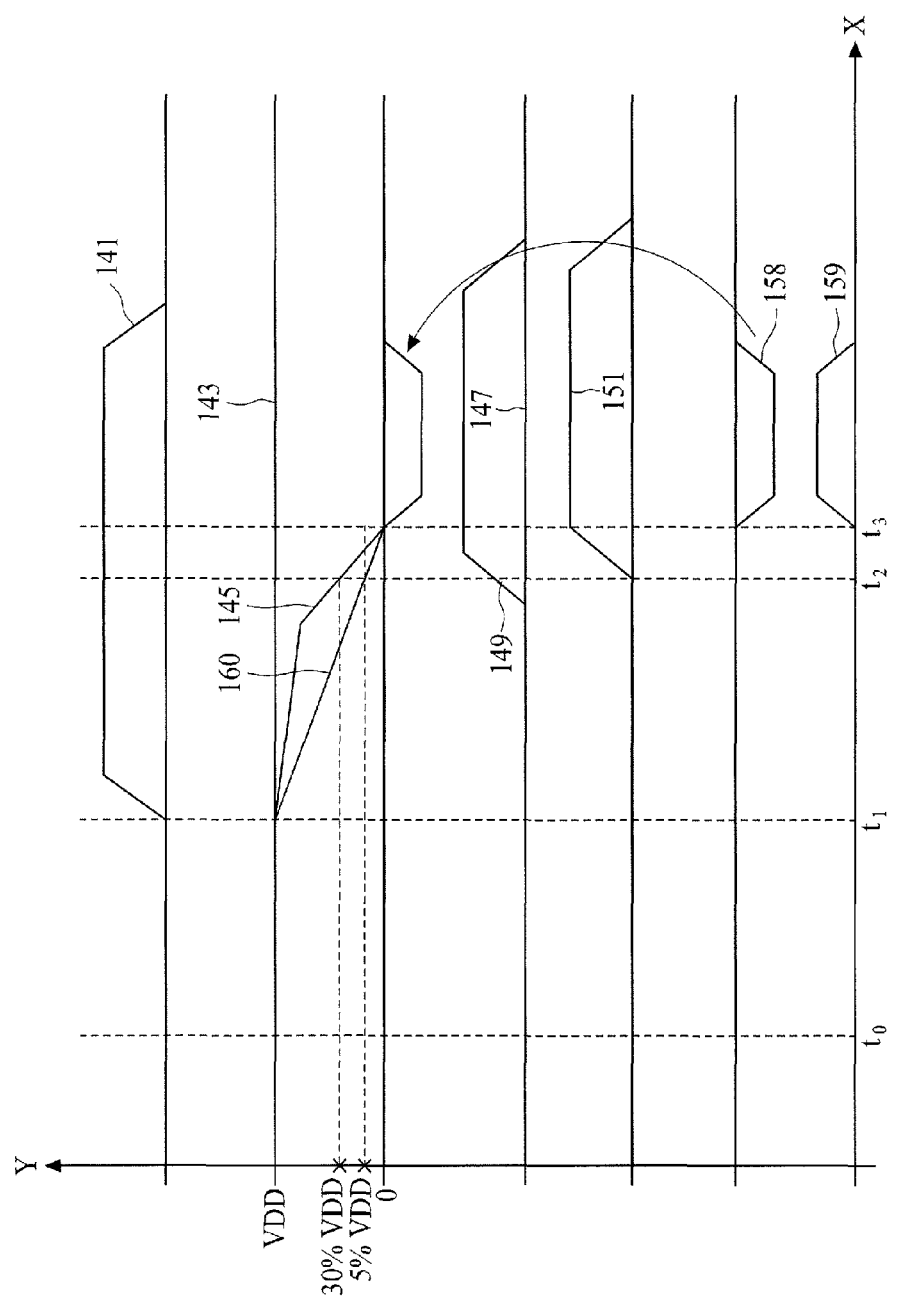
FIG. 3 illustrates exemplary waveforms of plural signals to operate the NBL circuit of FIG. 2, in accordance with some embodiments.

FIG. 3 illustrates exemplary waveforms of the W_E signal 141 (with which the complementary DATA signal 107 and DATA signal 109 vary), a voltage level on the BL 102-5 (hereinafter "signal 160," as shown in FIG. 2), the monitored signals 143 and 145, the first and second signals 147 and 149, the NBL_E signal 151, a voltage level at the node Z (hereinafter "signal 158," as also shown in FIG. 2), and a WL assertion signal 159 applied to the WL 102-9, respectively, in accordance with various embodiments. In some embodiments, each of the waveforms shown in FIG. 3 varies between Vdd and ground (0 V) (the Y axis of FIG. 3) over time (the X axis of FIG. 3) except for the waveform of the signal 158. In some embodiments, the signal 108 presents a negative voltage (i.e., below 0 V), which will be described in further detail below. In the following discussion of FIG. 3, Vdd corresponds to a high logical state (hereinafter "HIGH"), and ground corresponds to a low logical state (hereinafter "LOW").

Starting at time "t0" and continuing with the above example, before writing a logical 0 to the bit cell 102-1, the BL 102-5 and BBL 102-6 are pre-charged to Vdd, i.e., the signal 160 is at HIGH at time t0 (same as the monitored signals 143 and 145). Moreover, prior to, simultaneously with, or subsequently to time t0, the CS signal 111 (FIG. 2) is asserted to HIGH. Accordingly, the CCS signal 113 (FIG. 2), complementary to the CS signal 111, is asserted to LOW. In some embodiments, when the CS signal 111 is asserted to HIGH, the CS signal 131 is asserted to LOW. Accordingly, the CCS signal 133 (complementary to the CS signal 131) is asserted to HIGH. As such, based on the above-described operation principle of the TX gates 112, 114, 132, and 134, the TX gates 112 and 114, coupled to column A, are conducting (turned on); and the TX gates 132 and 134 (and other TX gates disposed between the pairs of (112 and 114) and (132 and 134)), coupled to other columns, are not conducting (turned off). Further, in response to the CS signal 111 being asserted to HIGH, the pair of column selection transistors 116 and 118, coupled to column A, are turned on, and other pairs of column selection transistors (including column selection transistors 136 and 138) are turned off. In other words, in this specific embodiment, only column A is selected.

Continuing to time "t1," the W_E signal 141 transitions from LOW to HIGH. In the illustrated embodiments of FIG. 2, when the W_E signal 141 transitions from LOW to HIGH, the complementary DATA signal 107 transitions from LOW to HIGH, and the DATA signal 109 transitions from HIGH to LOW. As such, the write enable transistor 140 is turned on, and the write enable transistor 142 is turned off. It is noted that the signal 153 (FIG. 2) is complementary to the NBL_E signal 151, so that at time t1, the signal 153 is at HIGH (the signal 151 is at LOW, as shown in FIG. 3). Once the write enable transistor 140 is turned on, a conduction path 180, as shown in FIG. 2, is formed from the node Y (still at Vdd), through the TX gate 112, the column selection transistor 116, the write enable transistor 140, the negative bit line enable transistor 144, and finally to ground.

Figure 4:
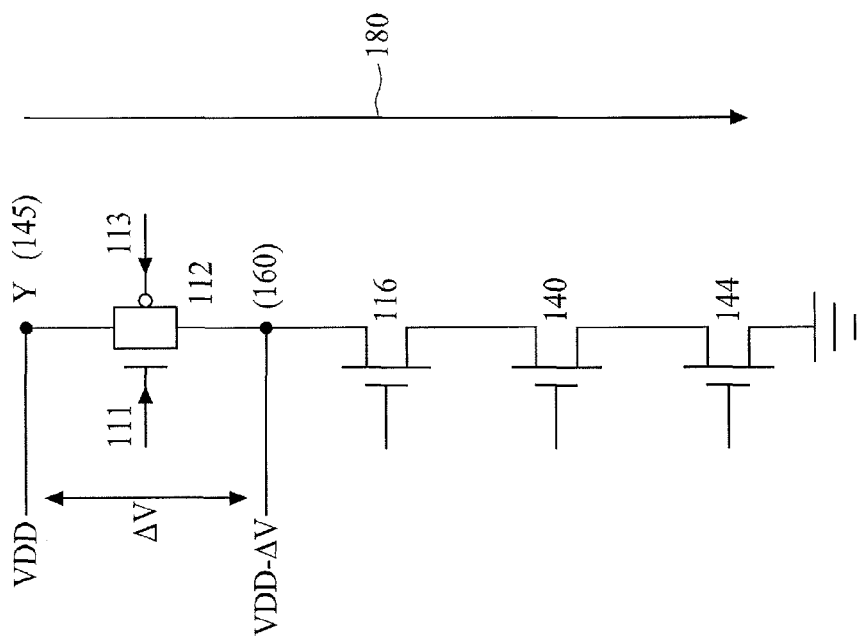
FIG. 4 illustrates an example of an equivalent circuit diagram of a conduction path formed in the NBL circuit of FIG. 2, in accordance with some embodiments.

In accordance with various embodiments of the present disclosure, once the TX gate 112 of the NBL circuit 110 is conducting and the conduction path 180 is formed, the conducted TX gate 112 may serve as a resistor with a relatively higher resistance value compared to other components (e.g., the column selection transistor 116, the write enable transistor 140, the negative bit line enable transistor 144, etc.) on the formed conduction path 180. As such, the TX gate 112 may cause a substantial amount of voltage drop (voltage division) from the node Y (the monitored signal 145) through the TX gate 112. This may be best illustrated with an equivalent circuit diagram of the conduction path 180, as shown in FIG. 4. Once the conduction path 180 is formed (from time t1), the signal 160 presents a substantially smaller (voltage) value (e.g., Vdd−ΔV) than the monitored signal 145 because of the substantial amount of voltage drop across the TX gate 112 (e.g., ΔV).

Referring again to FIG. 3, starting from time t1, the monitored signal 145, i.e., the voltage level at the node Y, and the signal 160, i.e., the voltage level present on the BL 102-5, starts to drop from Vdd toward ground, and the signal 143 (i.e., the voltage level at the node X) remains at Vdd, in accordance with some embodiments. It is clearly shown that the signal 160 varies with the monitored signal 145, and the signal 160 drops to ground at a substantially faster rate than the monitored signal 145 does, due to the voltage division across the TX gate 112, as described above. Such a faster-dropping signal 160 (compared to the monitored signal 145) provides a variety of advantages. For example, since the voltage level of the monitored signal 145 is monitored by the trigger circuit 148 and the voltage level of the signal 160 varies with the monitored signal 145 (and is always smaller than the monitored signal 145 by the voltage drop across the TX gate 112), the trigger circuit 148 may also monitor the voltage level of the signal 160. Further, with the "voltage drop across the TX gate 112," the trigger circuit 148 may assure the NBL_E signal 151 will be triggered (transitioned to HIGH) only when the voltage level of the signal 160 (i.e., the voltage level present on the BL 102-5) is substantially low (e.g., very close to 0 V).

As described above, when the monitored signals 143 and 145 remain at Vdd, the signals 147 and 149 may remain at LOW, which is shown in FIG. 3. However, as the monitored signals 143 and 145 drop below about the trip point of the trigger circuits 146 and 148 (e.g., 30% Vdd), the trigger circuits 146 and 148 may transition the signals 147 and 149 from LOW to HIGH, respectively.

Continuing to time "t2," the monitored signal 145 drops to about 30% Vdd and the signal 160 also drops to a substantially small voltage level, e.g., about 5% Vdd (again because of the voltage division across the TX gate 112), in accordance with some embodiments. As such, the trigger circuit 148 starts to transition the signal 149 from LOW to HIGH. And since the monitored signal 143 remains at Vdd, the trigger circuit 146 retains the signal 147 at LOW. Accordingly, the OR gate 150 may perform an OR logic function on the signals 147 and 149 (i.e., inputs of the OR gate 150), which are at LOW and HIGH, respectively. Based on the truth table of the OR logic function as shown in Table 1 below, the OR gate 150 starts to transition the NBL_E signal 151 (i.e., output of the OR gate 150) from LOW to HIGH. Thus, as described above, the NBL_E signal 151 isn't triggered until the signal 160 drops to a substantially small voltage level, in accordance with some embodiments.

TABLE 1

| Input 1 | Input 2 | Output |
|---------|---------|--------|
| 0 | 0 | 0 |
| 0 | 1 | 1 |
| 1 | 0 | 1 |
| 1 | 1 | 1 |

Continuing to time "t3," the NBL_E signal 151 is at HIGH. And more specifically, the signal 160 drops to an even smaller voltage level that is substantially close to 0 V. When the NBL_E signal 151 transitions to HIGH, the CNBL_E signal 153 transitions from HIGH to LOW. In some embodiments, consequently, the HIGH-to-LOW signal 153 decouples the node Z from ground, and allows the boosting capacitor 154 to provide a negative voltage to the node Z, which is shown as the signal 158 of FIG. 3. More particularly, the negative voltage 158 may be determined based on the following equation, $$Vdd \times \frac{C_{boosting}}{(C_Z + C_{boosting})}$$

wherein $C_{boosting}$ represents the capacitance value of the boosting capacitor 154, and $C_Z$ represents the capacitance value at the node Z. According to some embodiments, such $C_Z$ may be determined based on a variety of parameters such as, for example, a number of columns coupled to the node Z (a total of two columns (A and B) in the illustrated embodiment of FIG. 2), capacitance values of coupled BL's and BBL's (e.g., 102-5, 102-6, 102-7, 102-8, etc.), a capacitance value of a pull-down transistor of each coupled bit cell (e.g., 102-1, 102-2, 102-3, 102-4, etc.), etc.

In some embodiments, the negative voltage 158 may be applied to the selected column's BL. As described above, only column A is selected, and more specifically, the write enable transistor 140 is turned on (142 is turned off) so that the negative voltage 158 is applied to the BL 102-5, which is herein referred to as the "negative bit line (NBL) voltage" accordingly. This is also shown in FIG. 3 in which starting from time t3, the NBL voltage 158 is applied to the nearly-ground signal 160 (i.e., the voltage level present on the BL 102-5). To recap, to write a logical 0 to the bit cell 102-1, the BL 102-5 is applied with a ground voltage (that corresponds to the logical 0), and such an NBL voltage 158 applied on the BL 102-5 further pulls down the voltage level on the BL 102-5 below 0 V, and, in turn, may advantageously improve the write-ability of the bit cell 102-1, as mentioned above. In some embodiments, at time t3, when the NBL voltage 158 is generated, the WL assertion signal 159 concurrently transitions from LOW to HIGH, which allows the bit cell 102-1 to be accessed (e.g., to be written). As such, the bit cell 102-1 may be written with a logical 0 through the "negative" BL 102-5.

Although the above-provided example illustrates that the NBL 110 performs an operation of writing a logical 0 to the bit cell 102-1, it should be understood that the operation is applicable to write a logical 1 to the bit cell 102-1, and to write either a logical 1 or a logical 0 to other bit cells, etc. For example, in order to write a logical 1 to the bit cell 102-1, the NBL 110 may perform a substantially similar operation as described above by providing the NBL voltage 158 to the BBL 102-6 instead of the BL 102-5.

Figure 5:
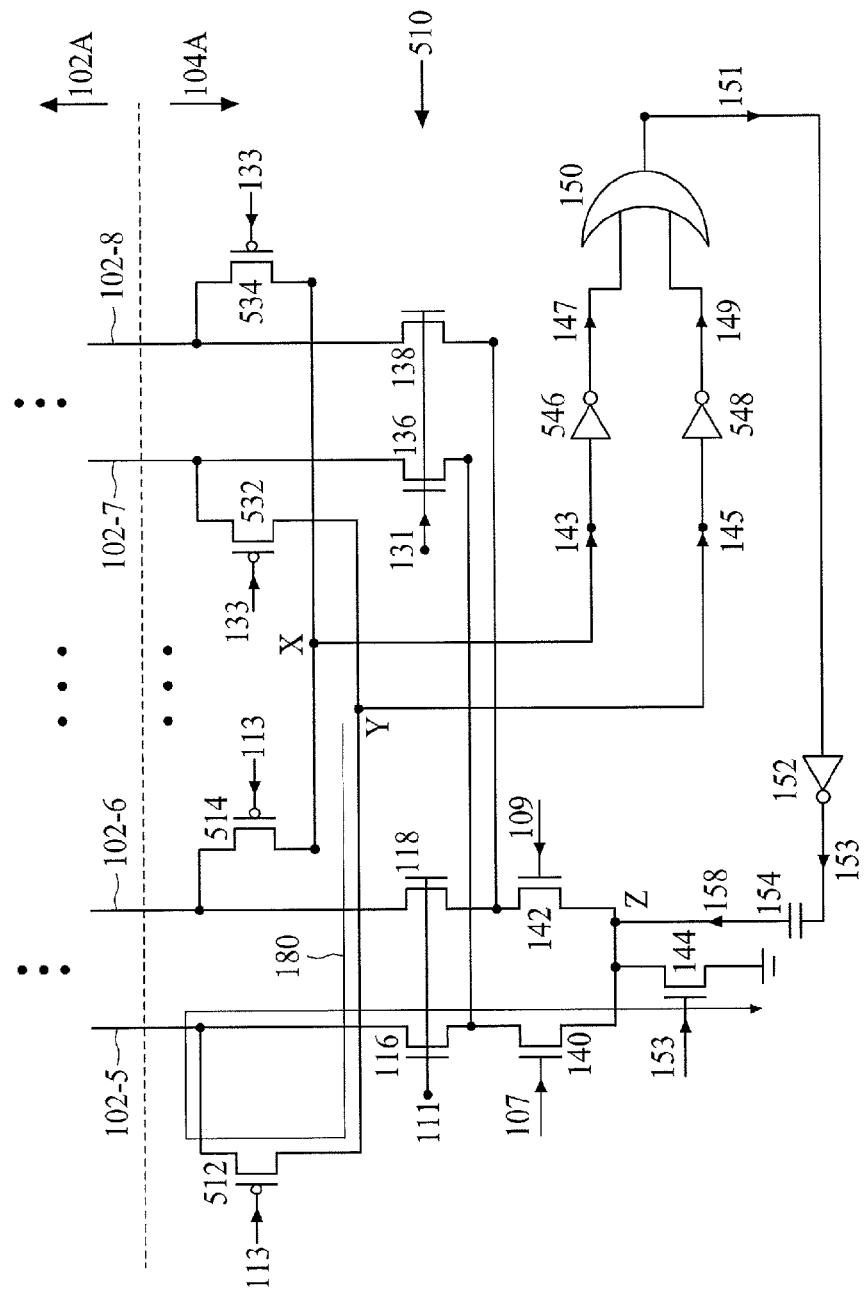
FIG. 5 illustrates another exemplary circuit diagram of the NBL circuit of FIG. 1, in accordance with some embodiments.

FIG. 5 illustrates an exemplary circuit diagram of another embodiment of an NBL circuit 510 included in the I/O circuit 104 of the memory device 100, in accordance with various embodiments. The NBL circuit 510 is substantially similar to the NBL circuit 110 of FIG. 2 except that the NBL circuit 510 uses a PMOS transistor (512, 514, 532, 534, etc.) instead of the TX gate (112, 114, 132, 134 of FIG. 2) and an inverter circuit (546 and 548) instead of the Schmitt trigger (146 and 148 of FIG. 2). Other than the PMOS transistor (512, 514, 532, 534, etc.) and the inverter circuit (546 and 548), each component of the NBL circuit 510 is substantially identical to the respective component of the NBL circuit 110 of FIG. 2. Also, the layout (i.e., the interconnection between each component) of the NBL circuits 110 and 510 are substantially similar to each other. Thus, numerals of signals and those identical components in the NBL circuit 110 of FIG. 2 will be used in the discussion of the NBL circuit 510 of FIG. 5.

For example, in the illustrated embodiment of the NBL circuit 510, the pair of column selection transistors 116 and 118 are coupled to the BL 102-5 and BBL 102-6 of column A, respectively; the pair of column selection transistors 136 and 138 are coupled to the BL 102-7 and BBL 102-8 of column B, respectively; the pair of write enable transistors 140 and 142 are each coupled to all the BL's and BBL's of the memory array 102A, respectively; the negative bit line enable transistor 144 is coupled between the pair of write enable transistors 140 and 142, and to ground. Further, the pair of column selection transistors 116 and 118 are gated by the CS signal 111, and the pair of column selection transistors 136 and 138 are gated by the CS signal 131, wherein the CS signal 131 is complementary to the CS signal 111. The write enable transistors 140 and 142 are gated by the complementary DATA signal 107 and DATA signal 109, respectively, wherein the complementary DATA signal 107 and DATA signal 109 vary with the W_E signal, as described above.

Regarding the PMOS transistors 512, 514, 532, and 534, each of the PMOS transistors 512, 514, 532, and 534 is substantially similar to the TX gate (e.g., 112) and is also gated by a CCS signal (e.g., 113, 133, etc.) except that the PMOS transistor is controlled by the CCS signal only (instead of both the CS signal and CCS signal, e.g., 111 and 113). Similarly, upon the PMOS transistors 512 and 514 being turned on by the CCS signal 113 and a conduction path (e.g., 180) being formed after the write enable transistor 140 is turned on, the PMOS transistor 512 serves as a resistor responsible for a substantial amount of voltage division along the conduction path 180.

Although the illustrated embodiments of FIGS. 2 and 5 use TX gates (112, 114, 132, 134, etc.) and PMOS transistors (512, 514, 532, 534, etc.) as "conducting gates," respectively, it is understood by people having ordinary skill in the art that such a conducting gate may be implemented as any of a variety of "gated" device such as, for example, an analog switch, a digital switch, etc., while remaining within the scope of the present disclosure.

Regarding the inverter circuits 546 and 548, each of the inverter circuits 546 and 548 is substantially similar to the Schmitt trigger (e.g., 146 and 148) except that the inverter circuit typically has a higher trip point, e.g., about 50% Vdd.

In some embodiments, the operation of the NBL circuit 510 is substantially similar to the NBL circuit 110. Thus, the operation of the NBL circuit 510 is briefly described as follows. Once the conduction path 180 is formed, the monitored signal 145 starts to drop. When the monitored signal 145 drops to the trip point of the inverter circuit 548 (e.g., 50% Vdd), the inverter circuit 548 starts to transition the signal 149 from LOW to HIGH. Since the monitored signal 143 remains at Vdd, the inverter circuit 546 retains the signal 147 at LOW. Accordingly, the OR gate 150 performs an OR logic function on the signals 147 and 149, which are at LOW and HIGH, respectively, to output the NBL_E signal 151 at HIGH. Accordingly, the CNBL_E signal is at LOW and the boosting capacitor 154 starts to provide the negative voltage 158 to the node Z, and couple the negative voltage 158 to the BL 102-5.

Figure 6A:
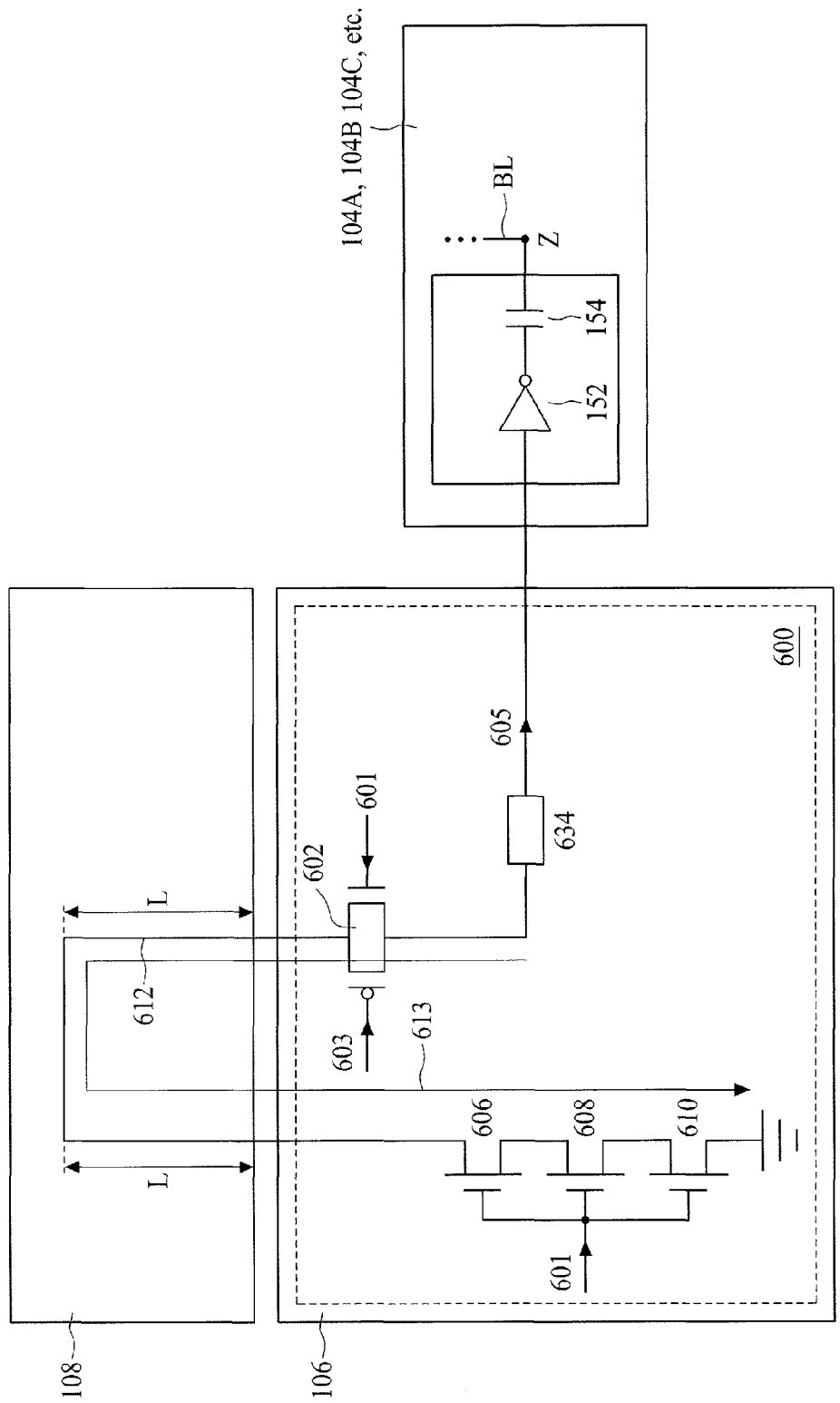
FIG. 6A illustrates an exemplary circuit diagram of the memory device of FIG. 1 in which a control logic circuit of the memory device includes a negative bit line (NBL) circuit, in accordance with some embodiments.
Figure 6B:
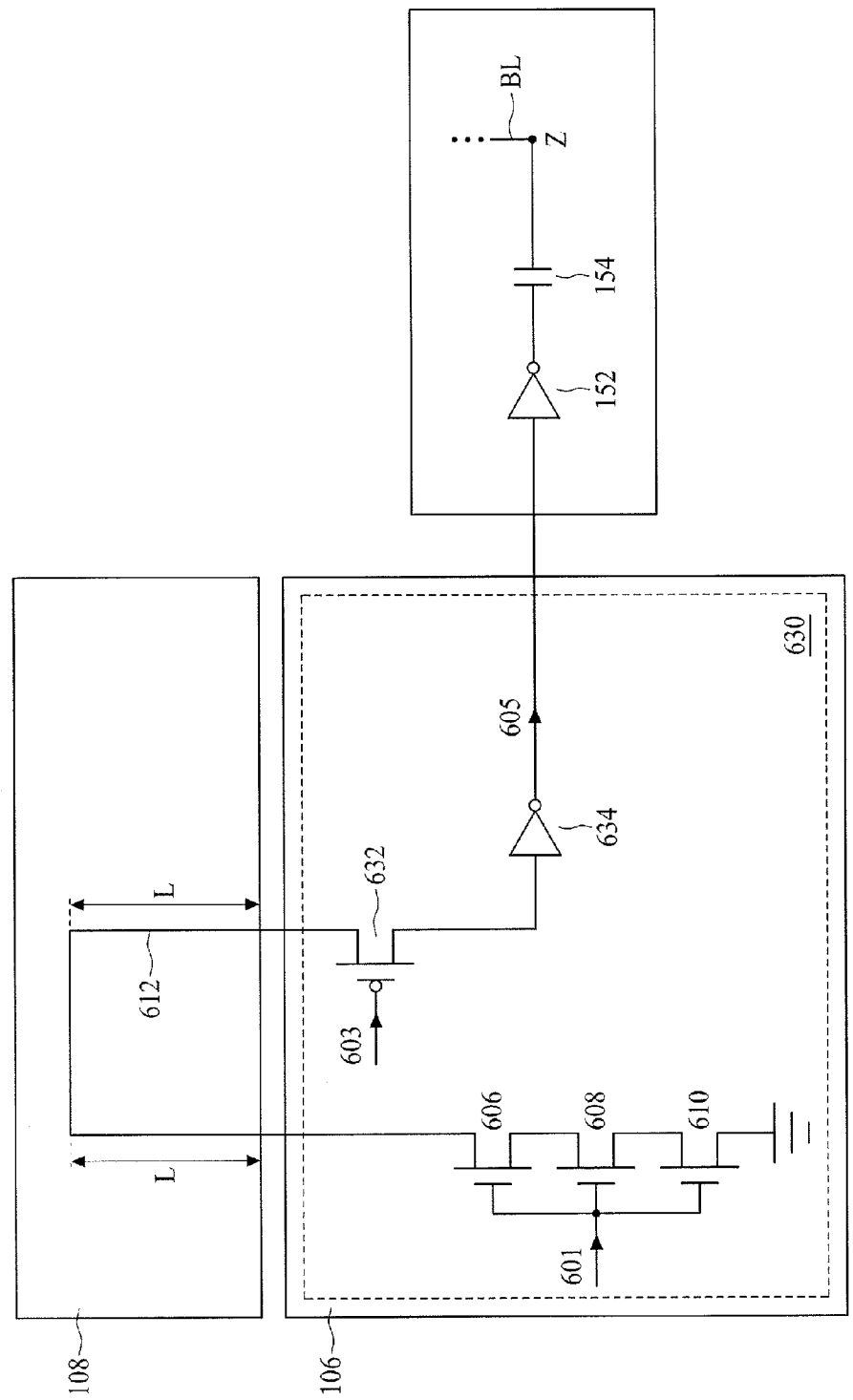
FIG. 6B illustrates another exemplary circuit diagram of the memory device of FIG. 1 in which a control logic circuit of the memory device includes another negative bit line (NBL) circuit, in accordance with some embodiments.

FIGS. 6A and 6B show part of circuit diagrams in which the control logic circuit 106 (FIG. 1) includes NBL circuits 600 and 630, respectively. As described above and further shown in FIGS. 6A and 6B, the NBL circuit (e.g., 600 and 630) included (or integrated) in the control logic circuit 106 may allow a negative bit line control signal 605 to be globally received by one or more coupled I/O circuits (104A, 104B, 104C, etc.). In response to receiving the negative bit line control signal 605 (at HIGH), each of the I/O circuits 104A, 104B, and 104C may use its respective inverter (e.g., 152) and boosting capacitor (e.g., 154) to generate a negative voltage for a BL that is used to write a logical 0, as described above.

In some embodiments, as shown in FIG. 6A, the NBL circuit 600 includes a TX gate 602, a Schmitt trigger 604, and transistors 606, 608, and 610. Further, the TX gate 602 is serially coupled to the transistors 606, 608, and 610 through a dummy bit line 612, wherein such a dummy bit line 612 is disposed in the row driver 108. Operatively, the NBL circuit 600 is substantially similar to the NBL circuit 110. For example, the (NMOS) transistors 606, 608, and 610 are gated by a write enable signal 601, and the TX gate 602 is gated concurrently by the write enable signal 601 and a signal 603 that is complementary to the write enable signal 601. For example, when the write enable signal 601 is at LOW (and the signal 603 is at HIGH accordingly), the TX gate 602 is conducting; when the write enable signal 601 is at HIGH (and the signal 603 is at LOW accordingly), the TX gate 602 is not conducting. More specifically, when the write enable signal 601 transitions from LOW to HIGH, the transistors 606, 608, and 610, and the TX gate 602 are all turned on. As such, a conduction path 613 is formed from node X, through the TX gate 602 and the transistors 606-610, to ground. Accordingly, the Schmitt trigger 604 may be able to monitor a voltage level on the node X (as described above with respect to FIG. 2), and once the voltage level at the node X drops below the trip point (e.g., 30% Vdd) of the Schmitt trigger 604, the Schmitt trigger 604 outputs the negative bit line control signal 605 at HIGH.

In some embodiments, the dummy bit line 612 may have a physical length (2×L) As shown, the dummy bit line 612 may be disposed vertically along the WL driver 108. Although in the illustrated embodiment of FIG. 6A, the dummy bit line 612 includes a short portion of length disposed horizontally across the WL driver 108, such a horizontal portion is substantially smaller compared to the physical length L. Accordingly, the length of the dummy bit line 612 is typically referred to as "2×L." More specifically, the physical length (2×L) that is about the same as a length of the BL of the memory arrays, e.g., BL's 102-5, 102-7, etc. As such, an RC response of the BL in the memory array(s) may be similarly simulated by the dummy bit line 612, which may allow the NBL circuit 600 to virtually monitor the voltage level of the BL in the memory array (e.g., signal 160) even though the NBL circuit 600 is not included in the memory array's respective I/O circuit.

The NBL circuit 630 of FIG. 6B is substantially similar to the NBL circuit 600 of FIG. 6A except that the TX gate 602 is replaced with a PMOS transistor 632 and the Schmitt trigger 604 is replaced with an inverter circuit 634. The PMOS transistor 632 and the inverter circuit 634 are substantially similar to the PMOS transistor (5112, 514, 532, 534, etc.) and the inverter circuit (546 and 548) of FIG. 5, respectively. Thus, for purpose of brevity, descriptions of the PMOS transistor 632 and the inverter circuit 634 are omitted.

Figure 7:
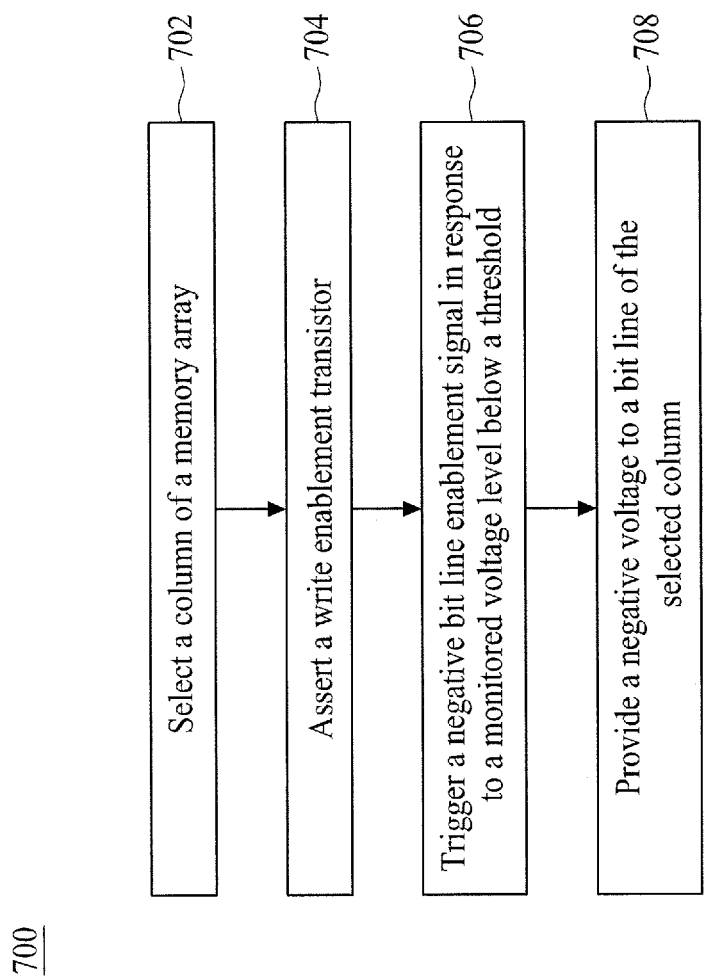
FIG. 7 illustrates a flow chart of a method to operate the NBL circuit of FIG. 1, in accordance with some embodiments.

FIG. 7 illustrates a flow chart of a method 700 to write a logical 0 to a bit cell of a memory array using a negative bit line technique, in accordance with various embodiments. In various embodiments, the operations of the method 700 are performed by the respective components illustrated in FIGS. 1-6. For purposes of discussion, the following embodiment of the method 700 will be described in conjunction with FIGS. 1-6. The illustrated embodiment of the method 700 is merely an example. Therefore, it should be understood that any of a variety of operations may be omitted, re-sequenced, and/or added while remaining within the scope of the present disclosure.

The method 700 starts with operation 702 in which a column of the memory array is selected, in accordance with various embodiments. Using the embodiment of FIG. 2 as an example, column A of the memory array 102A is selected by asserting the CS signal 111 to HIGH and the CCS signal 113 to LOW. Accordingly, the pair of TX gates coupled to column A start conducting.

The method 700 continues to operation 704 in which a write enable transistor is turned on, in accordance with various embodiments. In some embodiments, the turned-on write enable transistor may be coupled to a BL of the selected column. Once the write enable transistor is turned on, a conduction path may be formed so as to allow a voltage level on the BL to be monitored. Continuing with the above example, once the write enable transistor 140 is turned on (by the W_E signal as shown in FIG. 3), the conduction path 180 is formed. As shown in FIG. 2, the conduction path 180 is formed from the node Y, through the TX gate 112, the transistors 116, 140, and 144, to ground. As such, the voltage level present at the BL 102-5 (i.e., the signal 160) and the voltage level at the node Y (i.e., the signal 145) are concurrently monitored by the trigger circuit 148. In accordance with some embodiments of the present disclosure, during the operation 704, the voltage level of the signal 160 varies (drops) with the voltage level of the signal 145, and is substantially lower than the voltage level of the signal 145 by the voltage division across the TX gate 112.

The method 700 continues to operation 706 in which a NBL_E signal is triggered in response to the monitored voltage level of the BL, in accordance with various embodiments. In the above example, the trigger circuit 148 may transition the signal 149 from LOW to HIGH when the voltage level of the signal 145 drops below the trip point (e.g., 30% Vdd) of the trigger circuit 148. In some embodiments, the signal 147 may remain at LOW. As such, the OR gate 150 performs the OR logic function on the signals 147 and 149 so as to assert the NBL_E signal 151 to HIGH.

The method 700 continues to operation 708 in which a negative voltage is provided to the BL of the selected column, in accordance with various embodiments. Upon the NBL_E signal 151 transitioning to HIGH, the CNBL_E signal 153 transitions to LOW such that the negative bit line enable transistor 144 decoupled the node Z from ground and the boosting capacitor 154 starts to discharge. Consequently, the boosting capacitor 154 is allowed to provide the negative voltage 158 to the BL 102-5.

In an embodiment, a memory device is disclosed. The memory device includes: a memory array comprising a first plurality of bit cells arranged along a first column; and a negative bit line (NBL) circuit, coupled to the memory array, and comprising: a first pair of conducting gates that are coupled to the first plurality of bit cells through a bit line (BL) and a bit bar line (BBL) of the first column, respectively; and a pair of trigger circuits, coupled to the first pair of conducting gates, respectively, and configured to monitor voltage levels present on the BL and BBL of the first column through the respective first pair of conducting gates, and based on the monitored voltage levels, to assert an NBL enable signal so as to cause a negative voltage to be applied on either the BL or the BBL of the first column.

In another embodiment, a memory device includes a memory array comprising a first plurality of bit cells arranged along a first column; and a negative bit line (NBL) circuit, coupled to the memory array, and comprising: a first pair of PMOS transistors that are coupled to the first plurality of bit cells through a bit line (BL) and a bit bar line (BBL) of the first column, respectively; and a pair of inverter circuits, coupled to the first pair of PMOS transistors, respectively, and configured to monitor voltage levels present on the BL and BBL of the first column through the respective first pair of PMOS transistors, and based on the monitored voltage levels, to assert an NBL enable signal so as to cause a negative voltage to be applied on either the BL or the BBL of the first column.

Yet in another embodiment, a memory device includes a memory array comprising a plurality of bit cells arranged along a column; and a negative bit line (NBL) circuit, coupled to the memory array, and comprising: a pair of transmission (TX) gates that are coupled to the plurality of bit cells through a bit line (BL) and a bit bar line (BBL) of the column, respectively; a pair of trigger circuits, coupled to the pair of TX gates, respectively; and an OR logic gate coupled to the pair of trigger circuits, wherein the pair of trigger circuits configured to monitor voltage levels present on the BL and BBL of the column through the respective pair of TX gates, and based on the monitored voltage levels, to cause the OR logic gate to assert an NBL enable signal so as to cause a negative voltage to be applied on either the BL or the BBL of the column.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory array comprising a first plurality of bit cells arranged along a first column; and
   a negative bit line (NBL) circuit, coupled to the memory array, and comprising:
      a first pair of conducting gates that are coupled to the first plurality of bit cells through a bit line (BL) and a bit bar line (BBL) of the first column, respectively; and
      a pair of trigger circuits, coupled to the first pair of conducting gates, respectively, and configured to monitor voltage levels present on the BL and BBL of the first column through the respective first pair of conducting gates, and based on the monitored voltage levels, to assert an NBL enable signal so as to cause a negative voltage to be applied on either the BL or the BBL of the first column.

2. The memory device of claim 1, further comprising an OR logic gate coupled to the pair of trigger circuits.

3. The memory device of claim 2, wherein when the voltage level present on the BL is below a threshold, the OR logic gate asserts the NBL enable signal to a high logical state.

4. The memory device of claim 3, wherein each of the first pair of conducting gates comprises a transmission (TX) gate and serves as a resistor that causes a voltage drop on the respective voltage level present on the BL and BBL.

5. The memory device of claim 4, wherein the threshold is determined based on the voltage drop caused by the respective TX gate and a trip point of the respective trigger circuit that is about 30% of a supplied voltage of the memory device.

6. The memory device of claim 1, further comprising:
   an inverter, coupled to the pair of trigger circuits, and configured to receive the NBL enable signal; and
   a boosting capacitor, coupled to the inverter, and configured to provide the negative voltage to either the BL or the BBL of the first column based on a logical state of the NBL enable signal.

7. The memory device of claim 1, further comprising an input/output (I/O) circuit that is coupled to the memory array and includes the NBL circuit.

8. The memory device of claim 1, wherein the memory array comprises a second plurality of bit cells arranged along a second column, and the NBL circuit comprises a second pair of conducting gates that are coupled to the second plurality of bit cells through a bit line (BL) and a bit bar line (BBL) of the second column, respectively.

9. The memory device of claim 8, wherein the pair of trigger circuits, coupled to the second pair of conducting gates, respectively, and configured to monitor voltage levels present on the BL and BBL of the second column through the respective second pair of conducting gates, and based on the monitored voltage levels, to assert the NBL enable signal so as to cause the negative voltage to be applied on either the BL or the BBL of the second column.

10. The memory device of claim 1, wherein the trigger circuit includes a Schmitt trigger.

11. A memory device, comprising:
   a memory array comprising a first plurality of bit cells arranged along a first column; and
   a negative bit line (NBL) circuit, coupled to the memory array, and comprising:
      a first pair of PMOS transistors that are coupled to the first plurality of bit cells through a bit line (BL) and a bit bar line (BBL) of the first column, respectively; and
      a pair of inverter circuits, coupled to the first pair of PMOS transistors, respectively, and configured to monitor voltage levels present on the BL and BBL of the first column through the respective first pair of PMOS transistors, and based on the monitored voltage levels, to assert an NBL enable signal so as to cause a negative voltage to be applied on either the BL or the BBL of the first column.

12. The memory device of claim 11, further comprising an OR logic gate coupled to the pair of inverter circuits.

13. The memory device of claim 12, wherein when the voltage level present on the BL is below a threshold, the OR logic gate asserts the NBL enable signal to a high logical state.

14. The memory device of claim 13, wherein each of the first pair of PMOS transistors serves as a resistor that causes a voltage drop on the respective voltage level present on the BL and BBL.

15. The memory device of claim 14, wherein the threshold is determined based on the voltage drop caused by the respective PMOS transistors and a trip point of the respective inverter circuit that is about 50% of a supplied voltage of the memory device.

16. The memory device of claim 11, further comprising:
an inverter, coupled to the pair of inverter circuits, and configured to receive the NBL enable signal; and
a boosting capacitor, coupled to the inverter, and configured to provide the negative voltage to either the BL or the BBL of the first column based on a logical state of the NBL enable signal.

17. The memory device of claim 11, wherein the memory array comprises a second plurality of bit cells arranged along a second column, and the NBL circuit comprises a second pair of PMOS transistors that are coupled to the second plurality of bit cells through a bit line (BL) and a bit bar line (BBL) of the second column, respectively.

18. The memory device of claim 17, wherein the pair of inverter circuits, coupled to the second pair of PMOS transistors, respectively, and configured to monitor voltage levels present on the BL and BBL of the second column through the respective second pair of PMOS transistors, and based on the monitored voltage levels, to assert the NBL enable signal so as to cause the negative voltage to be applied on either the BL or the BBL of the second column.

19. A memory device, comprising
a memory array comprising a plurality of bit cells arranged along a column; and
a negative bit line (NBL) circuit, coupled to the memory array, and comprising:
a pair of transmission (TX) gates that are coupled to the plurality of bit cells through a bit line (BL) and a bit bar line (BBL) of the column, respectively;
a pair of trigger circuits, coupled to the pair of TX gates, respectively; and
an OR logic gate coupled to the pair of trigger circuits, wherein
the pair of trigger circuits configured to monitor voltage levels present on the BL and BBL of the column through the respective pair of TX gates, and based on the monitored voltage levels, to cause the OR logic gate to assert an NBL enable signal so as to cause a negative voltage to be applied on either the BL or the BBL of the column.

20. The memory device of claim 19, wherein each of the pair of TX gates serves as a resistor that causes a voltage drop on the respective voltage level present on the BL and BBL.

* * * * *